(12) United States Patent
Choa et al.

(10) Patent No.: US 7,433,567 B2
(45) Date of Patent: Oct. 7, 2008

(54) MULTI-QUANTUM WELL OPTICAL WAVEGUIDE WITH BROADBAND OPTICAL GAIN

(76) Inventors: Fow-Sen Choa, 10273 Bristol Channel, Ellicott City, MD (US) 21042; Tawee Tanbun-Ek, 17800 Colima Rd., Apt. 317, Rowland Heights, CA (US) 91748

( * ) Notice: Subject to any disclaimer, the term of this patent is extended or adjusted under 35 U.S.C. 154(b) by 298 days.

(21) Appl. No.: 11/105,912

(22) Filed: Apr. 13, 2005

(65) Prior Publication Data

US 2006/0233213 A1 Oct. 19, 2006

(51) Int. Cl.
G02B 6/10 (2006.01)
(52) U.S. Cl. .................. 385/131; 385/129; 385/130
(58) Field of Classification Search .............. None
See application file for complete search history.

(56) References Cited

U.S. PATENT DOCUMENTS 5,224,114 A 6/1993 Ikeda et al.

2001/0043629 A1* 11/2001 Sun et al. ................. 372/43

OTHER PUBLICATIONS

S. Ikeda, et al., "Semiconductor laser devices with a plurality of light emitting layers having different bands gap and methods for driving the same", IEEE Photonics Technology Letters, vol. 16, No. 2, Feb. 2004.

C.C. Huang, et al., "174-nm mode spacing in dual-wavelength semiconductor laser using non-identical InGaAsP quantum wells", IEEE Photonics Technology Letters, vol. 16, No. 2, pp. 371-373, Feb. 2004.

* cited by examiner

Primary Examiner—Sung H Pak
(74) Attorney, Agent, or Firm—Mathews, Shepherd, McKay & Bruneau, P.A.

(57) ABSTRACT

A multi-quantum well optical waveguide structure comprises a plurality of active regions including quantum wells with different gain peak wavelengths to provide an ultra broadband optical gain spectrum. Two adjacent sets of active regions having a large band gap difference are connected by a tunneling injection layer to provide smooth electron transport. Single transverse-mode operation is obtained by narrowly tapering the width of the multi-quantum well optical waveguide from the center to the two ends. Higher-order modes are suppressed at the output of the tapered waveguide, even though the center waveguide portion supports higher-order modes. In this way, the multi-quantum well optical waveguide can be utilized for ultra broadband optical amplification using a single mode fiber.

14 Claims, 9 Drawing Sheets

| | |
|---|---|
| CAP LAYER | 42e |
| 0.05um 1.05Q | ⎫ |
| 0.07um 1.3Q | ⎬ 1300nm LASER STAGE |
| 0.05um 1.05Q | |
| 0.1um Si-InP | ⎭ |
| 0.02um TUNNEL JUNCTION (C-InAlAs/Si-InP) | 43 |
| 0.1um Zn-InP | ⎫ 42d |
| 0.05um 1.05Q | ⎬ 1400nm LASER STAGE |
| 0.07um 1.4Q | |
| 0.05um 1.05Q | |
| 0.1um Si-InP | ⎭ |
| 0.02um TUNNEL JUNCTION (C-InAlAs/Si-InP) | 43 |
| 0.1um Zn-InP | ⎫ 42c |
| 0.05um 1.05Q | ⎬ 1600nm LASER STAGE |
| 0.07um 1.6Q | |
| 0.05um 1.05Q | |
| 0.1um Si-InP | ⎭ |
| 0.02um TUNNEL JUNCTION (C-InAlAs/Si-InP) | 43 |
| 0.1um Zn-InP | ⎫ 42b |
| 0.05um 1.05Q | ⎬ 1500nm LASER STAGE |
| 0.07um 1.5Q | |
| 0.05um 1.05Q | |
| 0.1um Si-InP | ⎭ |
| 0.02um TUNNEL JUNCTION (C-InAlAs/Si-InP) | 43 |
| 0.1um Zn-InP | ⎫ 42a |
| 0.05um 1.05Q | ⎬ 1200nm LASER STAGE |
| 0.07um 1.2Q | |
| 0.05um 1.05Q | ⎭ |
| SUBSTRATE | 41 |

MULTI-QUANTUM WELL OPTICAL WAVEGUIDE WITH BROADBAND OPTICAL GAIN

BACKGROUND OF THE INVENTION

1. Field of the Invention

This invention relates to an optical waveguide to produce an ultra broadband optical gain which can be used for broadband optical amplifiers and ultra-broadly tunable lasers in optical wavelength division multiplexing (WDM) network systems.

2. Description of Related Art

Semiconductor optical amplifiers and tunable lasers need broad band gain in order to fully utilize the advantage of optical WDM network systems. Quantum wells have been used in these devices to provide higher and broader optical gain. Multi-quantum (MQW) wells consisting of an identical composition and thickness can provide a typical gain spectrum of 60-70. Conventional methods have been used to broaden the gain spectrum beyond this range, see S. Ikeda et al., "Semiconductor laser devices with a plurality of light emitting layers having different bands gaps and methods for driving the same" IEEE Photonics Technology Letters, Vol. 16, No. 2, February 2004, and U.S. Pat. No. 5,224,114. Ikeda et al. describe light emitting layers of two different quantum wells having different band gaps which provide two different gain peak wavelengths. Since the total gain spectrum is a sum of the two gain spectra, the gain spectrum is broader than that obtained by using one type quantum well. Ikeda et al. describe AlGaAs/GaAs materials which have a wavelength range around 850 nm. However, Ikeda et al. has the following disadvantage. There is a barrier layer between the two different quantum wells, which has a larger band gap than the band gap of the two quantum wells. In order for the barrier layer to confine the carriers in the two adjacent quantum wells, the band gaps of the two quantum well materials cannot be too different because the carrier injection efficiency degrades.

In current WDM metro and long-haul optical communications systems, 1.3 μm and 1.5 μm wavelength ranges are used. In these wavelength ranges, a broad optical gain spectrum ranging from 1.3 μm to 1.5 μm has been required. C. C. Huang et al., "174-nm mode spacing in dual-wavelength semiconductor laser using non-identical InGaAsP quantum wells", IEEE Photonics Technology Letters, vol. 16, No. 2, pp. 371-373, February 2004. Using InGaAsP and InGaAs quantum wells to provide gain peak wavelengths of around 1.3 μm and around 1.5 μm, respectively. Accordingly, a broad gain spectrum range from 1356 nm to 1530 nm is achieved. However, Huang et al. has the following disadvantage. In order to broaden the gain spectrum band, the difference of the bandgaps of the two quantum wells materials needs to be larger. Since the barrier layer of InGaAsP is used for the two quantum wells, the larger band gap difference in the two quantum wells causes a degradation of carrier injection efficiency, resulting in the reduction of the magnitude of the gain.

It is desirable to provide an optical waveguide with improved higher and broader optical gain.

SUMMARY OF THE INVENTION

A multi-quantum well optical waveguide structure having quantum wells of different gain peak wavelengths provides an ultra broadband optical gain spectrum. A tunneling junction layer is disposed between two adjacent quantum wells having a large bandgap difference for making smooth electron transport. The multi-quantum well optical waveguide provides an ultra broadband optical gain to cover the full fiber transmission window from about 1200 nm to about 1700 nm (bandwidth of about 500 nm) and beyond.

In one embodiment, single transverse-mode operation is obtained by narrowly tapering the width of the multi-quantum well optical waveguide from the center to an end or the two ends to suppress higher-order transverse mode excitation The invention will be more fully described by reference to the following drawings.

DETAILED DESCRIPTION

Reference will now be made in greater detail to a preferred embodiment of the invention, an example of which is illustrated in the accompanying drawings. Wherever possible, the same reference numerals will be used throughout the drawings and the description to refer to the same or like parts.

Figure 1:
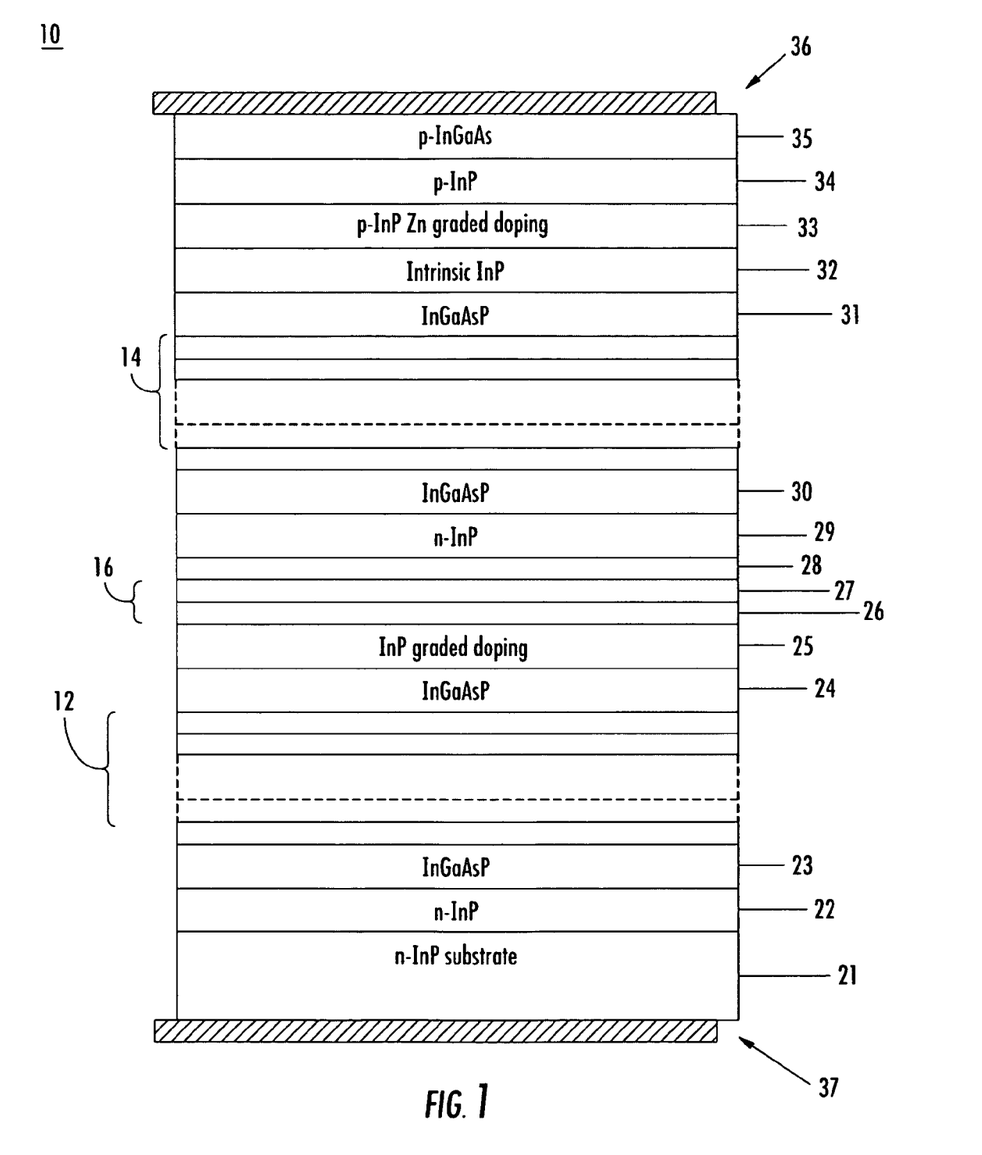
FIG. 1 is a schematic diagram of a multi-quantum well optical waveguide structure in accordance with an embodiment of the invention.

FIG. 1 is a schematic diagram of a multi-quantum well waveguide transverse structure 10 in accordance with the teachings of the present invention. Multi-quantum well waveguide transverse structure 10 comprises first active region 12 and second active region 14. Tunneling junction layer 16 is disposed between first active region 12 and second active region 14 making injection efficiency higher with transporting electrons through the whole quantum well regions. First active region 12 can comprise a plurality of quantum wells for providing a predetermined gain peak wavelength. For example, first active region 12 can comprise six quantum wells having a predetermined thickness for providing a gain peak wavelength of 1.45 μm. In this embodiment, first active region 12 comprises six quantum wells of about 5 nm thick InGaAsP with 1.45 μm bandgap wavelength and five barriers of about 8 nm thick InGaAsP with 1.5 μm bandgap wavelength. Second active region 14 can comprise a plurality of quantum wells for providing a predetermined gain peak wavelength. For example, second active region 14 can comprise six quantum wells having a predetermined thickness for providing a gain peak wavelength of 1.55 μm. In this embodiment, second active region 14 comprises six quantum wells of about 6 nm thick InGaAs with 1.55 μm bandgap wavelength and five barriers of about 8 nm thick InGaAsP with 1.1 μm bandgap wavelength.

In one embodiment, n-InP buffer layer 22 is provided on n-InP substrate 21. n-InP buffer layer 22 can have a thickness of about 0.139 μm. InGaAsP layer 23 is disposed on n-InP buffer layer 22. InGaAsP layer 23 can have a thickness of about 0.1 μm to provide a 1.1 μm bandgap wavelength. First active region 12 is disposed on InGaAsP layer 23. InGaAsP layer 24 is disposed on first active region 12. InGaAsP layer 24 can have a thickness of about 0.1 μm to provide a 1.1 μm bandgap wavelength. p-InP layer 25 is disposed on InGaAsP layer 24 as a doping layer. p-InP layer 25 can have a thickness of about 60 nm.

Tunneling junction layer 16 can be diposed on p-InP layer 25 which doping level is graded from low to high. For example, tunneling junction layer 16 comprises p+-InP layer 26 (with Zn as p-dopant), p+-InAlAs layer 27 (with carbon as p-dopant), and n+-InP layer 28 (with Si as n-dopant).

p-InP layer 29 can be disposed on tunneling junction layer 16. p-InP layer 29 acts as a doping layer and can have a thickness of about 60 nm. InGaAsP layer 30 is disposed on p-InP layer 29. InGaAsP layer 30 can have a thickness of about 0.1 μm to provide a 1.1 μm bandgap wavelength. Second active region 14 is disposed on InGaAsP layer 30. InGaAsP layer 31 is disposed on second active region 14. InGaAsP layer 31 can have a thickness of about 0.1 μm to provide a 1.1 μm bandgap wavelength.

InP layer 32 can be disposed in InGaAsP layer 31. InP layer 32 can have a thickness of about 0.2 μm. p-InP layer 33 can be disposed on InP layer 32. p-InP layer 33 can be a graded doping layer having a thickness of about 0.3 μm. p-InP layer 34 can be disposed on p-InP layer 33. p-InP layer 34 can have a thickness of about 1.1 μm. p-InGaAs contact layer 35 can be disposed on p-InP layer 34. p-InGaAs layer 35 can be a contact layer having a thickness of about 0.16 μm. p metal layer 36, such as Ti—Pt—Au, is disposed on p-InGaAs layer 35. n metal layer 37, such as Au—Ge, can be disposed on n-InP substrate 21.

Figure 2:
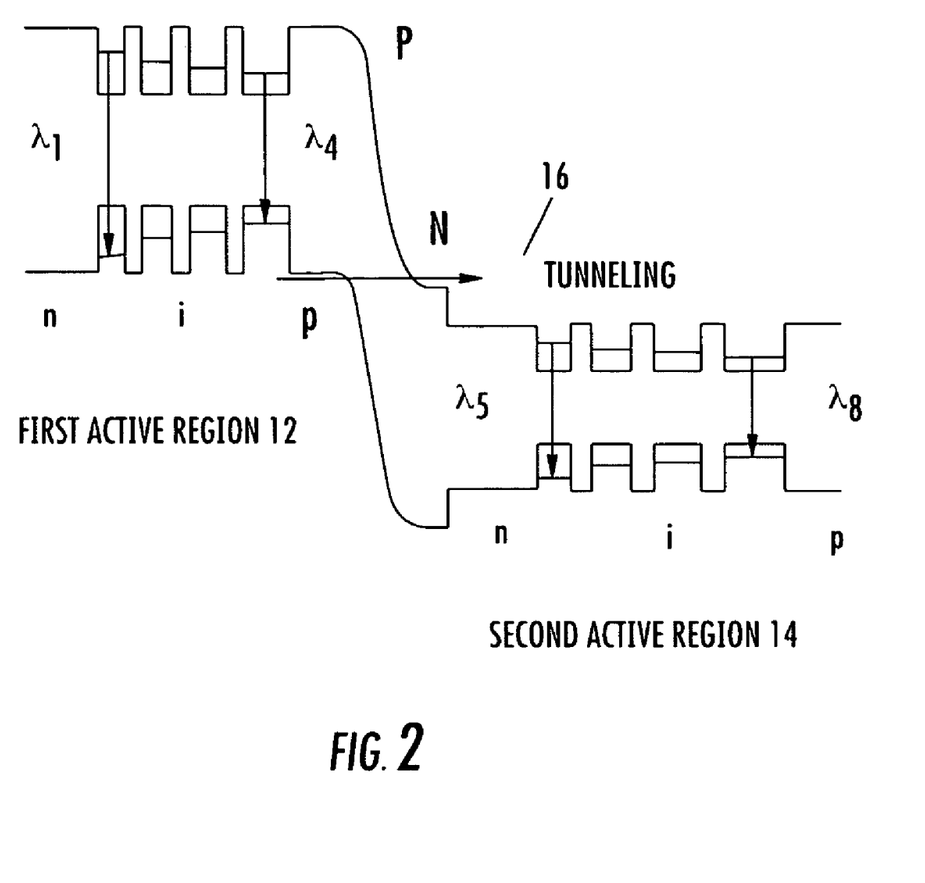
FIG. 2 is a schematic band energy diagram of the multi-quantum well optical waveguide structure shown in FIG. 1.

FIG. 2 illustrates a band diagram of multi-waveguide structure 10 showing tunneling junction layer 16 and first active region 12 which have different band gap energies. Variable thickness of the quantum wells described above can be used to spread the gain peak wavelengths. The band gap wavelength of the first set of the multi-quantum well layers of first active region 12 (on the left-hand side of the diagram) varies from $\lambda_1$ to $\lambda_4$, and the bandgap wavelength of the second set of the multi-quantum well layers at the second active region 14 (on the right-hand side of the diagram) from $\lambda_5$ to $\lambda_8$. In this way, the broad gain spectrum ranging from $\lambda_1$ to $\lambda_8$ can be generated. The large band-gap wavelength difference between $\lambda_4$ to $\lambda_5$ is connected smoothly by tunneling junction layer 16.

Figure 3:
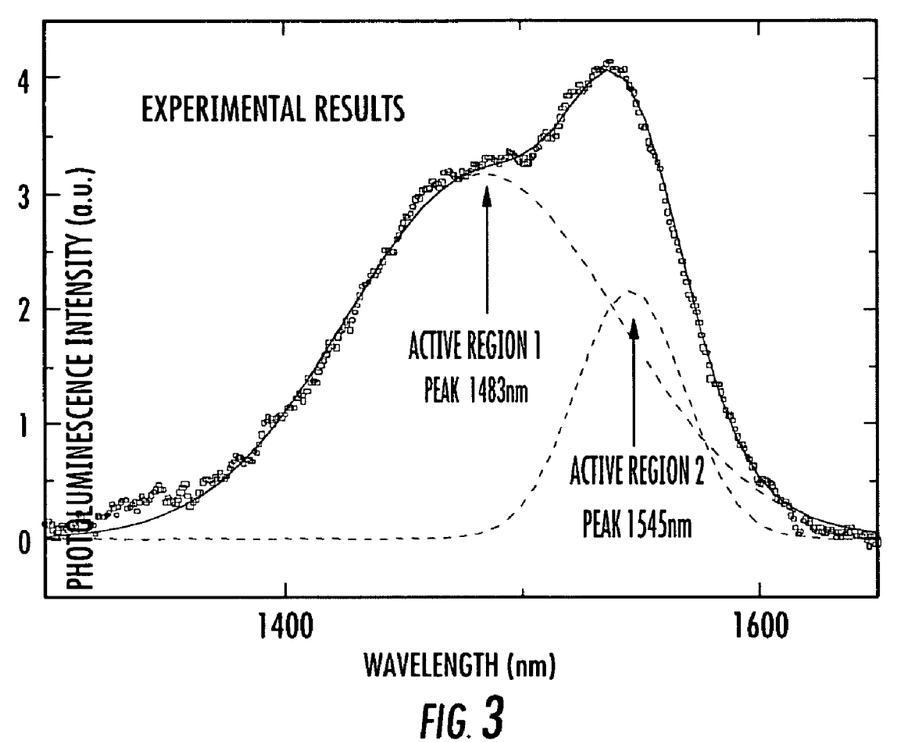
FIG. 3 is a measured gain spectrum of the multi-quantum well optical waveguide structure shown in FIG. 1.

FIG. 3 is a measured gain spectrum of multi-quantum well waveguide transverse structure 10 shown in FIG. 1. The gain profile is not smooth in first active region 12 because all quantum wells in each p-i-n section are the same size.

Figure 4A:
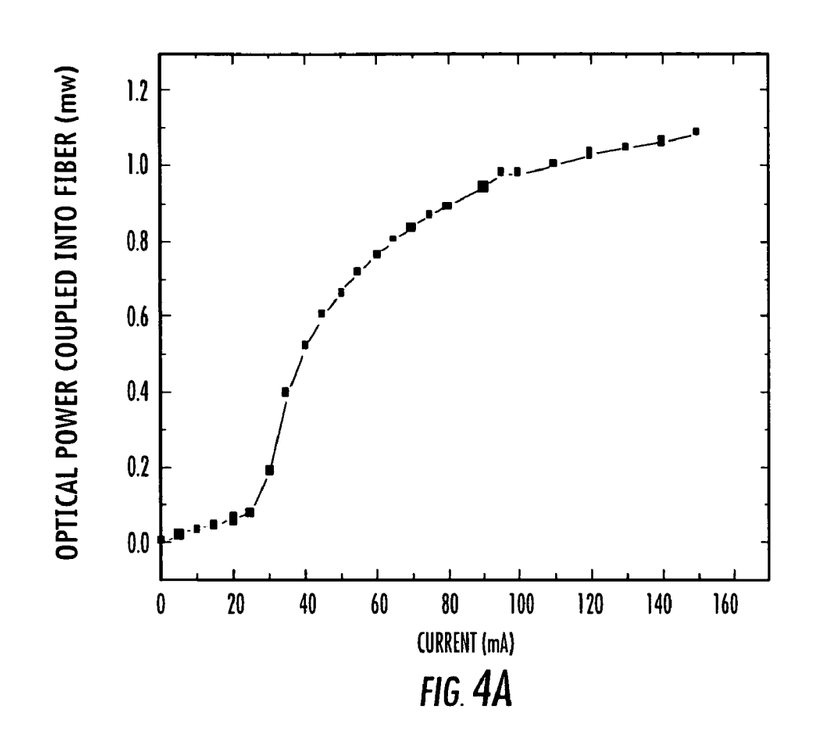
FIG. 4A is a measured output power versus current relation of the laser when the bias is set above a threshold.
Figure 4B:
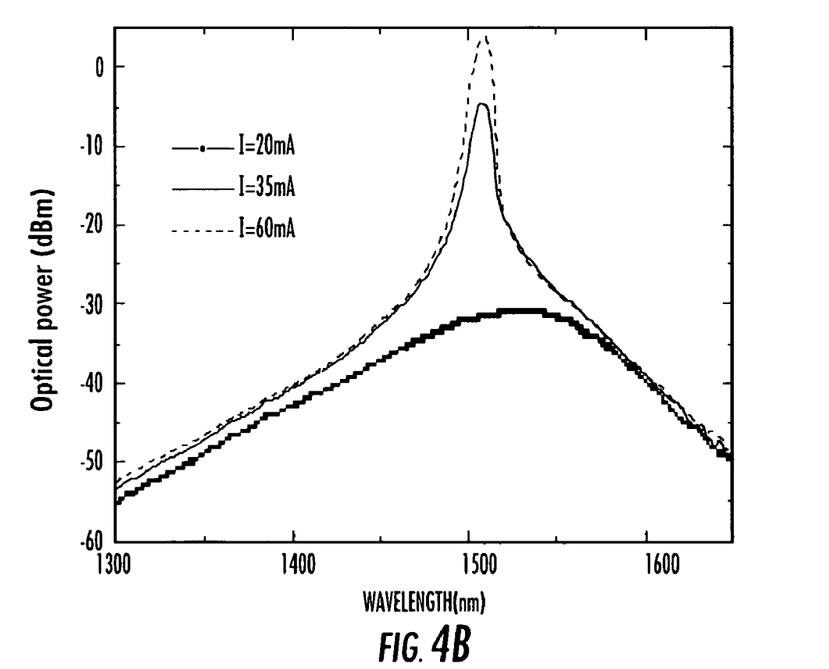
FIG. 4B is the laser output spectrum. The lasing wavelength is at the middle of the two-gain region.

FIG. 4A shows the measured output power versus current relation of the laser when the bias is set above a threshold. FIG. 4B shows the laser output spectrum. The lasing is obtained at the middle of the two peak wavelengths of the two gain regions.

With the presence of multiple gain materials connected by tunnel junctions, it has been found that it is difficult to achieve single mode waveguides since the layer thickness in the vertical direction is large, for example, in the range of greater than about 4000 nm thick. It has been found that using a waveguide width of about 1 um wide waveguide in the horizontal direction obtains a multi-mode waveguide.

Figure 5:
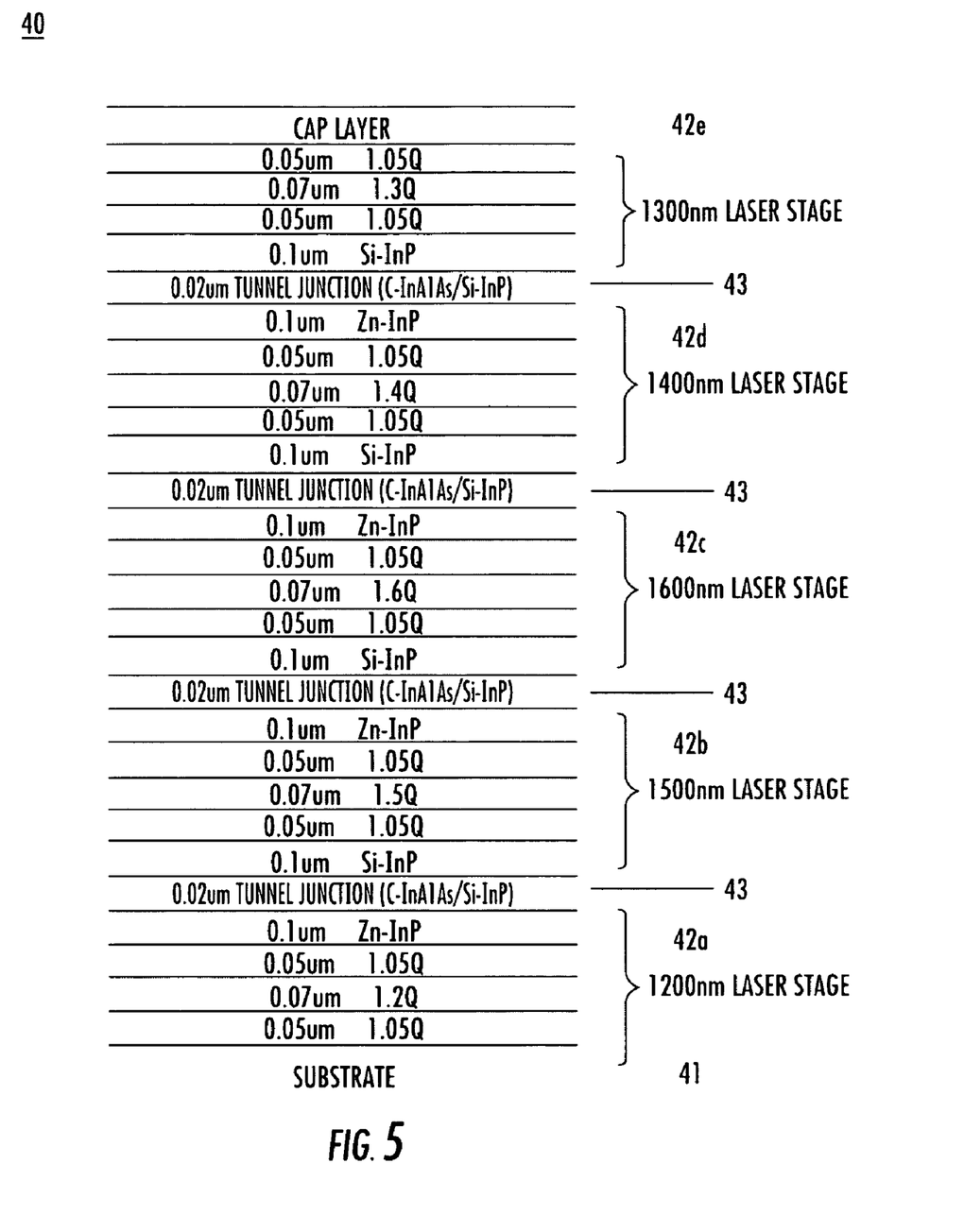
FIG. 5 is a schematic diagram of a multi-quantum well optical waveguide structure in accordance with an alternate embodiment of the present invention.

FIG. 5 illustrates an alternate embodiment of the present invention. Multi-quantum well waveguide transverse structure 40 comprises five different sets of active layers 42a-42e each with different gain peak wavelengths disposed on substrate 41. For example, the five sets of active layers 42a-42e can have gain peak wavelengths of 1200 nm for active layer 42a, 1300 nm for active layer 42e, 1400 nm for active layer 42d, 1500 nm for active layer 42b, and 1600 nm for active layer 42c. Each set of adjacent active layers 42a-42e is connected to tunneling layer 43.

An example embodiment of multi-quantum well waveguide transverse structure 40 comprises active layer 42a formed of about 0.05 μm thick InGaAsP layer with a 1.05 μm bandgap wavelength, about 0.07 μm thick InGaAsP layer with 1.2 μm bandgap wavelength, about 0.05 μm thick InGaAsP layer with 1.05 μm bandgap wavelength, and about 0.1 μm thick p-InP.layer (p-type dopant is, for example, Zn). Active layer 42b is formed of about 0.1 μm thick n-InP layer, (n-type dopant is, for example, Si) about 0.05 μm thick InGaAsP layer having a bandgap wavelength of 1.05 μm, about 0.07 μm thick InGaAsP layer having a bandgap wavelength of 1.05 μm, about 0.07 μm thick InGaAsP layer having a bandgap wavelength of 1.50 μm, about 0.05 μm thick InGaAsP layer having a bandgap wavelength of 1.05 μm, and about 0.1 μm thick p-InP layer. Active layer 42c is formed of about 0.1 μm thick n-InP layer, about 0.05 μm thick InGaAsP layer having a bandgap wavelength of 1.05 μm, about 0.07 μm thick InGaAsP layer having a bandgap wavelength of 1.6 μm, about 0.05 μm thick InGaAsP layer having a bandgap wavelength of 1.05 μm, and about 0.1 μm thick layer of p-InP. Active layer 42d is formed of about 0.1 μm thick n-InP layer, about 0.05 μm thick InGaAsP layer having a bandgap wavelength of 1.05 μm, about 0.07 μm thick InGaAsP layer having a bandgap wavelength of 1.4 μm, about 0.05 μm thick InGaAsP layer having a bandgap wavelength of 1.05 μm and about 0.1 μm thick p-InP layer. Tunneling layer 43 can comprise, for example, C—InAlAs and n-InP.

Active layer 42e is formed of about 0.1 μm thick n-InP layer, about 0.05 μm thick Q layer with a 1.05 μm bandgap wavelength, about 0.07 μm thick InGaAsP layer with a 1.30 μbandgap wavelength, about 0.05 μm thick InGaAsP layer with a 1.05 μm bandgap wavelength and a cap region including a 1.5 μm thick p-InP layer and a 150 nm thick p-InGaAs layer.

Figure 6:
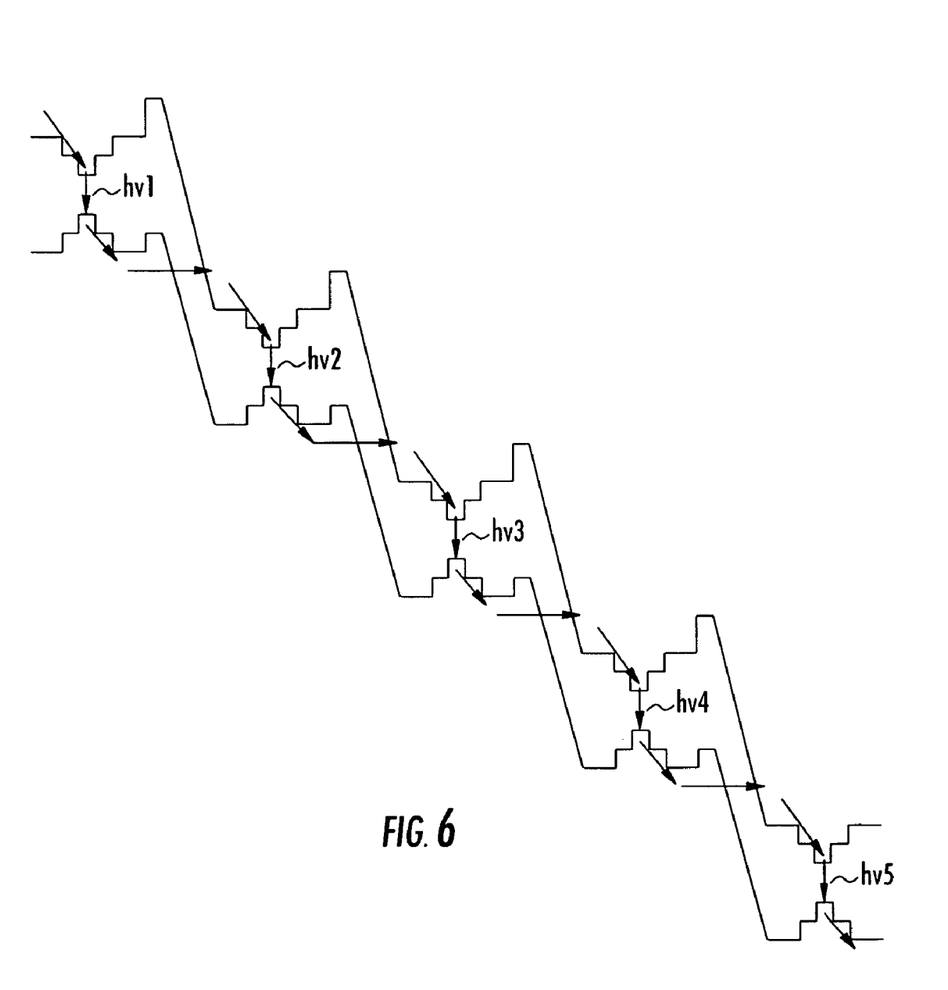
FIG. 6 is a schematic band energy diagram of the multi-quantum well optical waveguide structure shown in FIG. 5.

FIG. 6 shows a band diagram of the whole layer structure which comprises five different sets of active layers shown in FIG. 5. The gain peak wavelengths of the first set of active layers to the fifth set of active layers vary from $\lambda_1$ to $\lambda_5$. In this way, the broad gain spectrum ranging from $\lambda_1$ to $\lambda_5$ can be generated. The large band-gap wavelength difference between $\lambda_1$ to $\lambda_5$ is connected smoothly by the tunneling junction layers. Without tunneling junction layers, the carrier injection into the whole structure is very difficult due to large band barriers for electrons and holes.

Figure 7:
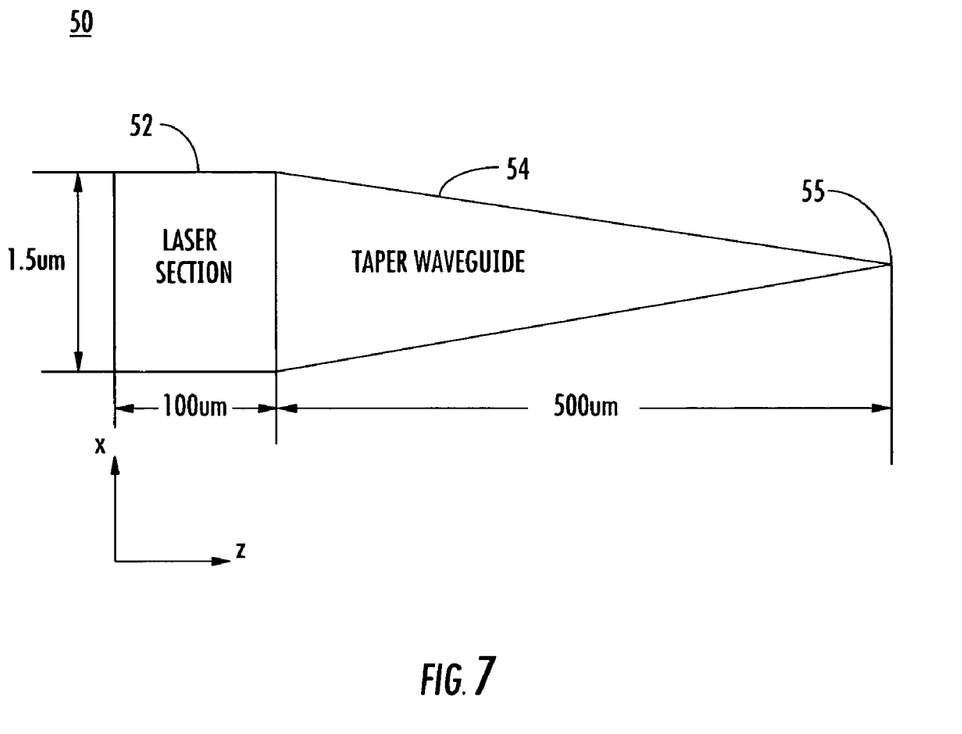
FIG. 7 is a schematic diagram of the multi-quantum well optical waveguide structure equipped with a tapered waveguide in accordance with another embodiment of the invention.

An alternate embodiment of the invention is shown in FIG. 7, which provides a method to achieve single mode operations, which are useful for most broadband optical communication applications. The approach is to make narrow gradually the width of the waveguide in the horizontal direction to provide a tapered waveguide. In this way, higher-order modes are suppressed for excitation and only a fundamental transverse mode is maintained. Tapered waveguide 50 includes laser section 52 and tapered waveguide section 54. For example, laser section 52 can have a length of about 100 μm and tapered waveguide section 54 can have a length of about 500 µm. Laser section 52 has a width of about 1.5 µm which gradually tapers to point section 55 of tapered waveguide section 54. Both the higher transverse modes excited by a transverse thickness larger than the lowest transverse (vertical) mode thickness and the higher lateral (horizontal) modes excited by a lateral width larger than the lowest lateral mode width, will decay as they propagate along the horizontal direction due to their larger propagation loss compared to the propagation loss of the lowest mode.

In a typical amplifier operation, input signal from one side of the amplifier waveguide will adiabatically expand its transverse mode to cover the full cross section of the large multimode waveguide without generating higher order modes. It is possible that there may be a small amount of energy transferred to the higher mode due to certain non-uniformity along the waveguide. The majority of the modal energy will stay at the fundamental mode if the adiabatic mode expander if the waveguide quality is uniform. When the signal propagates to the output side of the amplifier waveguide, the output adiabatic mode expander serves as the modal filter to transfer the fundamental mode signal back to the smaller cross section single mode waveguide and strip off the residue higher order modes.

Figure 8:
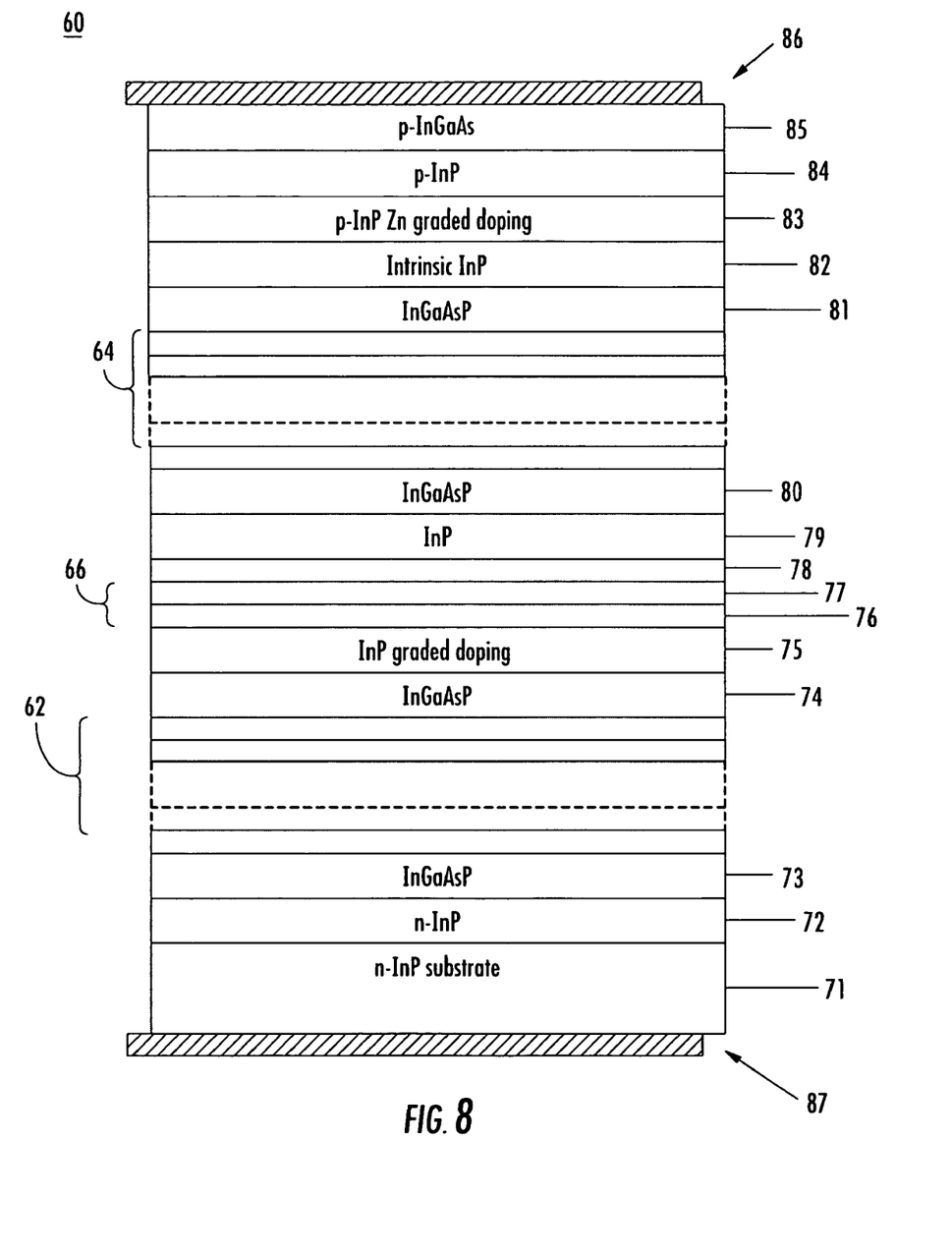
FIG. 8 is a schematic diagram of the multi-quantum well optical waveguide structure used for mode profile simulation.

FIG. 8 is a schematic diagram of multi-quantum well waveguide transverse structure 60 of an alternate embodiment.

Multi-quantum well waveguide transverse structure 60 comprises first active region 62 and second active region 64. Tunneling junction layer 66 is disposed between first active region 62 and second active region 64 making injection efficiency higher with transporting electrons through the whole quantum well regions. First active region 62 can comprise a plurality of quantum wells for providing a predetermined gain peak wavelength. For example, first active region 62 can comprise six quantum wells having a predetermined thickness for providing a gain peak wavelength of 1.3 µm. In this embodiment, first active region 62 comprises six quantum wells of about 5 nm thick InGaAsP with 1.3 µm bandgap wavelength and five barriers of about 8 nm thick InGaAsP with 1.1 µm bandgap wavelength. Second active region 64 can comprise a plurality of quantum wells for providing a predetermined gain peak wavelength. For example, second active region 64 can comprise six quantum wells having a predetermined thickness for providing a gain peak wavelength of 1.55 µm. In this embodiment, second active region 64 comprises six quantum wells of about 6 nm thick InGaAs with 1.55 µm bandgap wavelength and five barriers of about 8 nm thick InGaAsP with 1.1 µm bandgap wavelength.

In one embodiment, n-InP buffer layer 72 is provided on n-InP substrate 71. n-InP buffer layer 72 can have a thickness of about 0.139 µm. InGaAsP layer 73 is disposed on n-InP buffer layer 72. InGaAsP layer 73 can have a thickness of about 0.1 µm to provide a 1.1 µm bandgap wavelength. First active region 62 is disposed on InGaAsP layer 73. InGaAsP layer 74 is disposed on first active region 62. InGaAsP layer 74 can have a thickness of about 0.1 µm to provide a 1.1 µm bandgap wavelength. p-InP layer 75 is disposed on InGaAsP layer 74 as a doping layer. p-InP layer 75 can have a thickness of about 0.2 µm.

Tunneling junction layer 66 can be disposed on p-InP layer 75. For example, tunneling junction layer 66 can have a thickness of about 13 nm. Tunneling junction layer 66 can comprise InAlAs layer 76, n-InP layer 77 and n-InP layer 78. For example, InAlAs layer 76 can have a thickness of about 13 nm, n-InP layer 77 can have a thickness of about 2 nm, and n-InP layer 78 can have a thickness of about 13 nm.

p-InP layer 79 can be disposed on tunneling junction layer 66. p-InP layer 79 acts as a doping layer and can have a thickness of about 0.2 µm. InGaAsP layer 80 is disposed on p-InP layer 79. InGaAsP layer 80 can have a thickness of about 0.1 µm to provide a 1.1 µm bandgap wavelength. Second active region 64 is disposed on InGaAsP layer 80. InGaAsP layer 81 is disposed on second active region 64. InGaAsP layer 81 can have a thickness of about 0.1 µm to provide a 1.1 µm bandgap wavelength.

InP layer 82 can be disposed in InGaAsP layer 81. InP layer 82 can have a thickness of about 0.2 µm. p-InP layer 83 can be disposed on InP layer 82. p-InP layer 83 can be a graded doping layer having a thickness of about 0.3 µm. p-InP layer 84 can be disposed on p-InP layer 83. p-InP layer 84 can have a thickness of about 1.1 µm. p-InGaAs contact layer 85 can be disposed on p-InP layer 84. p-InGaAs layer 85 can be a contact layer having a thickness of about 0.16 µm. p metal layer 86, such as Ti—Pt—Au, is disposed on p-InGaAs layer 85. n metal layer 87, such as Au—Ge, can be disposed on n-InP substrate 71.

Figure 9A:
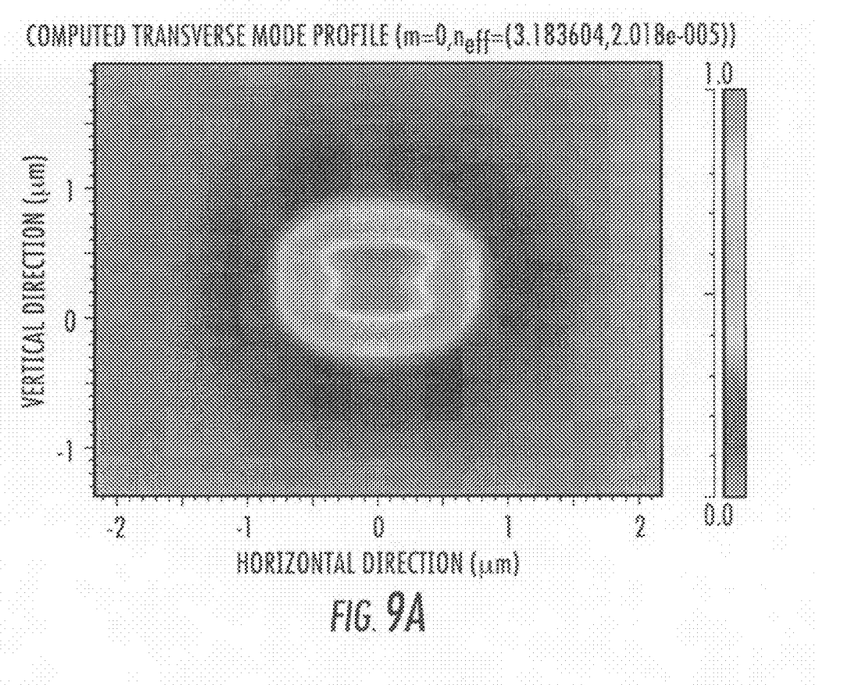
FIG. 9A is a simulated mode profile of the waveguide structure in FIG. 8 at z=100 μm.
Figure 9B:
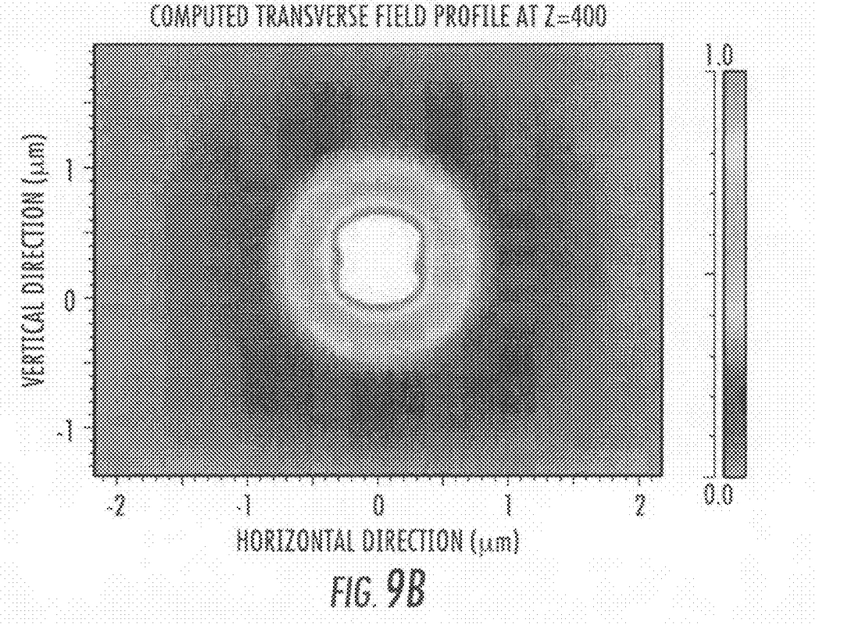
FIG. 9B is a simulated mode profile of the waveguide structure in FIG. 8 at z=400 μm.

A mode profile simulation has been conducted for the embodiment shown in FIG. 8. The simulated mode profiles at z=100 µm and z=400 µm are shown in FIGS. 9A and 9B, respectively.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

What is claimed is:

1. An optical waveguide comprising:
   a plurality of active regions, each of said active regions having a predetermined gain peak wavelength, and
   a tunneling layer disposed between adjacent ones of said active regions,
   said waveguide comprises a laser section and a tapered section, said tapered section having a narrowing width,
   wherein said predetermined gain peak wavelength is different for each of said active layers to provide a broad optical gain spectrum and said waveguide provides a fundamental transverse mode.

2. The optical waveguide of claim 1 wherein each of said active regions comprises a plurality of quantum wells.

3. The optical waveguide of claim 2 wherein each of said quantum wells has a different gain peak wavelength.

4. The optical waveguide of claim 3 wherein a thickness of each of said well of each of quantum wells and thickness of a barrier between each of said wells is selected to provide said gain peak of said quantum wells.

5. The optical waveguide of claim 1 further comprising:
   a doping layer disposed between said tunneling junction layer and said adjacent active region.

6. The optical waveguide of claim 5 wherein said doping layer is p type.

7. The optical waveguide of claim 1 further comprising:
   a doping layer disposed an at least one of said active regions.

8. The optical waveguide of claim 7 wherein said doping layer is p type.

9. The optical waveguide of claim 1 wherein the optical gain spectrum is in the range of about 1200 nm to about 1700 nm.

10. A method of making an optical waveguide comprising the steps of:

a. forming a plurality of active regions, each of said active regions having a predetermined gain peak wavelength, and
b. disposing a tunneling layer between adjacent ones of said active regions, wherein said predetermined gain peak wavelength is different for each of said active layers to provide a broad optical gain spectrum; and tapering said waveguide for providing a narrowing width.

11. The method of claim 10 wherein in step a., each of said active regions are formed by forming a plurality of quantum wells.

12. The method of claim 11 wherein each of said quantum wells has a different gain peak wavelength.

13. The method of claim 12 further comprising the step of:

selecting a thickness of each of said wells; and selecting a thickness of a barrier between each of said wells to provide said gain peak of said quantum wells.

14. The method of claim 10 wherein the optical gain spectrum is in the range of about 1200 nm to about 1700 nm.

* * * * *